US008594194B2

(12) United States Patent
Youn

(10) Patent No.: US 8,594,194 B2
(45) Date of Patent: Nov. 26, 2013

(54) COMPRESSION METHOD USING ADAPTIVE FIELD DATA SELECTION

(75) Inventor: Jeongnam Youn, San Jose, CA (US)

(73) Assignees: Sony Corporation, Tokyo (JP); Sony Electronics Inc., Parkridge, NJ (US)

( * ) Notice: Subject to any disclaimer, the term of this patent is extended or adjusted under 35 U.S.C. 154(b) by 734 days.

(21) Appl. No.: 12/580,218

(22) Filed: Oct. 15, 2009

(65) Prior Publication Data

US 2011/0090956 A1    Apr. 21, 2011

(51) Int. Cl.
*H04N 7/32*    (2006.01)
(52) U.S. Cl.
USPC ........................................... 375/240.12
(58) Field of Classification Search
USPC ....................... 375/240.01, 240.12
IPC ....................................... H04N 7/32
See application file for complete search history.

(56) References Cited

U.S. PATENT DOCUMENTS

| 2001/0008425 | A1* | 7/2001 | Shin et al. | 348/452 |
| 2006/0228036 | A1* | 10/2006 | Avinash | 382/254 |
| 2008/0204598 | A1* | 8/2008 | Maurer et al. | 348/584 |
| 2009/0148062 | A1* | 6/2009 | Gabso et al. | 382/266 |

* cited by examiner

*Primary Examiner* — Jay Patel
*Assistant Examiner* — Yulin Sun
(74) *Attorney, Agent, or Firm* — Haverstock & Owens LLP

(57) ABSTRACT

A compression method using adaptive field data selection is able to compress video or other data while retaining quality. By determining if pixels in a field are able to be predicted, the method is able to retain the information that is not able to be predicted and predict the other information. The method enables significant compression of the data which allows larger data such as high definition videos to be compressed and effectively used.

36 Claims, 14 Drawing Sheets

COMPRESSION METHOD USING ADAPTIVE FIELD DATA SELECTION

FIELD OF THE INVENTION

The present invention relates to the field of video processing. More specifically, the present invention relates to video compression.

BACKGROUND OF THE INVENTION

In a video codec (coder/decoder) application, an input video is stored into an external memory before being encoded. Since the amount of data for High Density (HD) video resolution is huge, the required bandwidth is significantly higher than standard density video. For a low power application, power consumption caused by data transfer via an external bus is a burden.

There have been attempts at compressing video such as deinterlacing which preserves only part of the video and then reconstructs the part of the video not preserved using the preserved part. The problem with the deinterlacing implementation is that it produces various visual artifacts. For better performance, "motion compensated" deinterlacing is preferred. However, due to computational complexity, "motion compensated" deinterlacing is not feasible in many applications.

SUMMARY OF THE INVENTION

A compression method using adaptive field data selection is able to compress video or other data while retaining quality. By determining if pixels in a field are able to be predicted, the method is able to retain the information that is not able to be predicted and predict the other information. The method enables significant compression of the data which allows larger data such as high definition videos to be compressed and effectively used.

In one aspect, a method of compressing data implemented on a device comprises checking neighboring data elements in a first field of a current data element in a second field, if the current data element is able to be predicted using neighboring data elements, then the current data element is removed and if the current data element is not able to be predicted using the neighboring data elements, then the current data element is retained. Checking neighboring pixels includes determining directional gradients for each direction of a set of directions based on the neighboring pixels of the current pixel, determining a set of maximum gradients of the directional gradients, a maximum gradient for each direction of the set of directions and determining a minimum gradient of the set of maximum gradients. The current data element is retained includes coding and inserting the current data element into a compressed item if the minimum gradient is greater than a first threshold, computing a variance of the neighboring data elements if the minimum gradient is not greater than the first threshold and coding and inserting the current data element into the compressed item if the variance is greater than a second threshold. The current data element is removed includes not sending information if the variance is not greater than the second threshold. The method further comprises repeating the steps for data elements in a second field. The method further comprises rearranging the second field. The set of directions include vertical, 45° and −45°. The compressed data is selected from the group consisting of an image, a video, a sound and music. The device is selected from the group consisting of a personal computer, a laptop computer, a computer workstation, a server, a mainframe computer, a handheld computer, a personal digital assistant, a cellular/mobile telephone, a smart appliance, a gaming console, a digital camera, a digital camcorder, a camera phone, an iPod®, a video player, a DVD writer/player, a television and a home entertainment system.

In another aspect, a method of compressing data implemented on a device comprises checking neighboring pixels in a first field of a current pixel in a second field, if the current pixel is able to be predicted using neighboring pixels, then the current pixel is removed and if the current pixel is not able to be predicted using the neighboring pixels, then the current pixel is retained. Checking neighboring pixels includes determining directional gradients for each direction of a set of directions based on the neighboring pixels of the current pixel, determining a set of maximum gradients of the directional gradients, a maximum gradient for each direction of the set of directions and determining a minimum gradient of the set of maximum gradients. The current pixel is retained includes coding and inserting the current pixel into a compressed video if the minimum gradient is greater than a first threshold, computing a variance of the neighboring pixels if the minimum gradient is not greater than the first threshold and coding and inserting the current pixel into the compressed video if the variance is greater than a second threshold. The current pixel is removed includes not sending information if the variance is not greater than the second threshold. The method further comprises repeating the steps for pixels in a second field. The method further comprises rearranging the second field. The set of directions include vertical, 45° and −45°. The compressed data is selected from the group consisting of an image and a video. The device is selected from the group consisting of a personal computer, a laptop computer, a computer workstation, a server, a mainframe computer, a handheld computer, a personal digital assistant, a cellular/mobile telephone, a smart appliance, a gaming console, a digital camera, a digital camcorder, a camera phone, an iPod®, a video player, a DVD writer/player, a television and a home entertainment system.

In another aspect, a method implemented on a device comprises determining directional gradients for each direction of a set of directions based on neighboring pixels of a current pixel, determining a set of maximum gradients of the directional gradients, a maximum gradient for each direction of the set of directions, determining a minimum gradient of the set of maximum gradients, coding and inserting the current pixel into a compressed data if the minimum gradient is greater than a first threshold, computing a variance of the neighboring pixels if the minimum gradient is not greater than the first threshold, coding and inserting the current pixel into the compressed data if the variance is greater than a second threshold and not sending information if the variance is not greater than the second threshold. The method further comprises repeating the steps for pixels in a field. The method further comprises rearranging the field. The method further comprises decompressing the compressed data. The method further comprises reconstructing data by regenerating the pixels that were not coded and inserted. The set of directions include vertical, 45° and −45°. The compressed data is selected from the group consisting of an image and a video. The device is selected from the group consisting of a personal computer, a laptop computer, a computer workstation, a server, a mainframe computer, a handheld computer, a personal digital assistant, a cellular/mobile telephone, a smart appliance, a gaming console, a digital camera, a digital camcorder, a camera phone, an iPod®, a video player, a DVD writer/player, a television and a home entertainment system.

In another aspect, a system implemented on a device configured for compressing data comprises a gradient determination module configured for determining one or more gradients, a variance determination module operatively coupled to the gradient determination module, the variance determination module configured for determining a variance and an encoding module operatively coupled to the variance determination module, the encoding module configured for encoding video. The gradient determination module is further configured to determine the gradients, determine maximum gradients of the gradients and compare a minimum gradient of the maximum gradients with a first threshold. The variance determination module is further configured to compare the variance with a second threshold. The encoding module is further configured to code and insert a pixel or to not send information, depending on results of the gradient determination module and the variance determination module. The device is selected from the group consisting of a personal computer, a laptop computer, a computer workstation, a server, a mainframe computer, a handheld computer, a personal digital assistant, a cellular/mobile telephone, a smart appliance, a gaming console, a digital camera, a digital camcorder, a camera phone, an iPod®, a video player, a DVD writer/player, a television and a home entertainment system.

In yet another aspect, a device comprises a memory for storing an application, the application configured for determining directional gradients for each direction of a set of directions based on neighboring pixels of a current pixel, determining a set of maximum gradients of the directional gradients, a maximum gradient for each direction of the set of directions, determining a minimum gradient of the set of maximum gradients, coding and inserting the current pixel into a compressed data if the minimum gradient is greater than a first threshold, computing a variance of the neighboring pixels if the minimum gradient is not greater than the first threshold, coding and inserting the current pixel into the compressed data if the variance is greater than a second threshold and not sending information if the variance is not greater than the second threshold and a processing component coupled to the memory, the processing component configured for processing the application. The application is further configured for repeating i-vii for pixels in a field. The application is further configured for rearranging the field. The application is further configured for decompressing the video. The application is further configured for reconstructing data by regenerating the pixels that were not coded and inserted. The set of directions include vertical, 45° and −45°. The device is selected from the group consisting of a personal computer, a laptop computer, a computer workstation, a server, a mainframe computer, a handheld computer, a personal digital assistant, a cellular/mobile telephone, a smart appliance, a gaming console, a digital camera, a digital camcorder, a camera phone, an iPod®, a video player, a DVD writer/player, a television and a home entertainment system.

DETAILED DESCRIPTION OF THE PREFERRED EMBODIMENT

Figure 1:
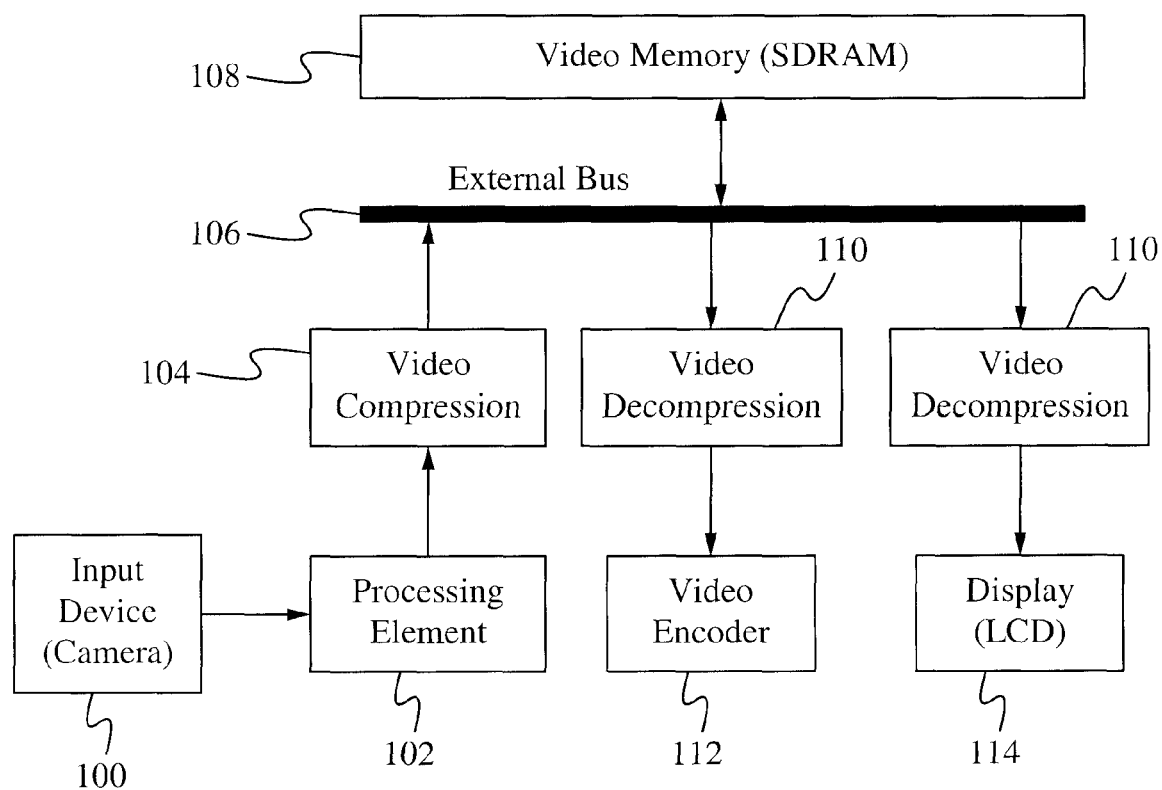
FIG. 1 illustrates a diagram of functional blocks of encoding a video according to some embodiments.

In order to reduce bus bandwidth, a method to compress an input video before storing in the external video memory has been developed. A video encoder or display device retrieves the compressed video and then decompresses the video before processing. Since the video data is compressed, the required bus bandwidth is able to be much lower than the original scheme. The functional blocks of the method are presented in FIG. 1. An input device 100 such as a camera or camcorder receives/acquires data such as a video or an image. The data goes to a processing element 102 to be processed. The data is then compressed at a video compression component 104. The compressed data reaches other components via a bus 106 such as video memory (SDRAM) 108. The compressed data is also able to be encoded at a video encoder 112, but the data is decompressed at a video decompressor 110 before being encoded. The compressed data is also able to be displayed at a display 114, but the data is decompressed at the video decompressor 110 before being displayed.

Figure 2:
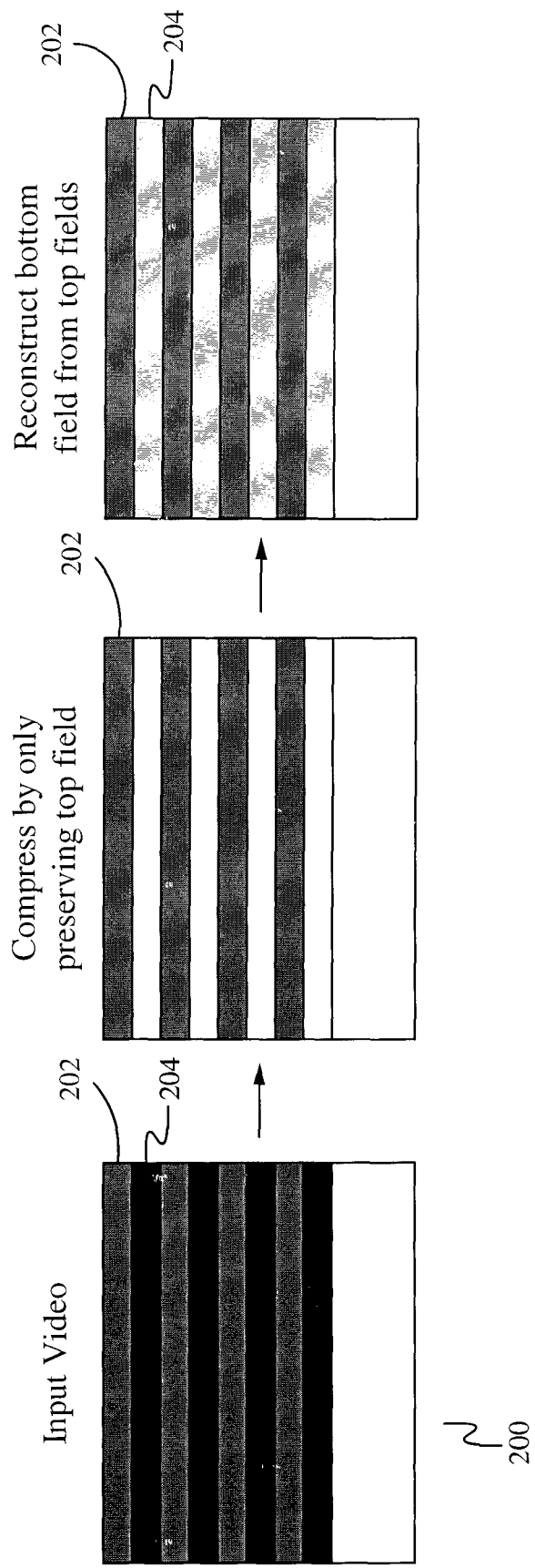
FIG. 2 illustrates a diagram of a compression method according to some embodiments.

One compression method preserves one of the fields in the video data as shown in FIG. 2. For example, an input video 200 (e.g. 60 P) is compressed by only preserving a top field 202, and a bottom field 204 is reconstructed from the top field 202. Since one field (e.g. the bottom field in this example) is completely removed, the video data is able to be compressed to half size. Although the compression ratio is high since one field is removed, the main concern is quality degradation of the decompressed video. Since there is no data in the bottom field at the decompressor, the missing bottom field is reconstructed using only top fields. However, it is very difficult to produce a good quality of bottom data using only top fields.

In order to reconstruct a good quality video with a high compression ratio, a method to adaptively compress the bottom field is able to be used. Instead of removing an entire bottom field, pixels are intelligently selected to be removed without causing a significant quality degradation.

Figure 3:
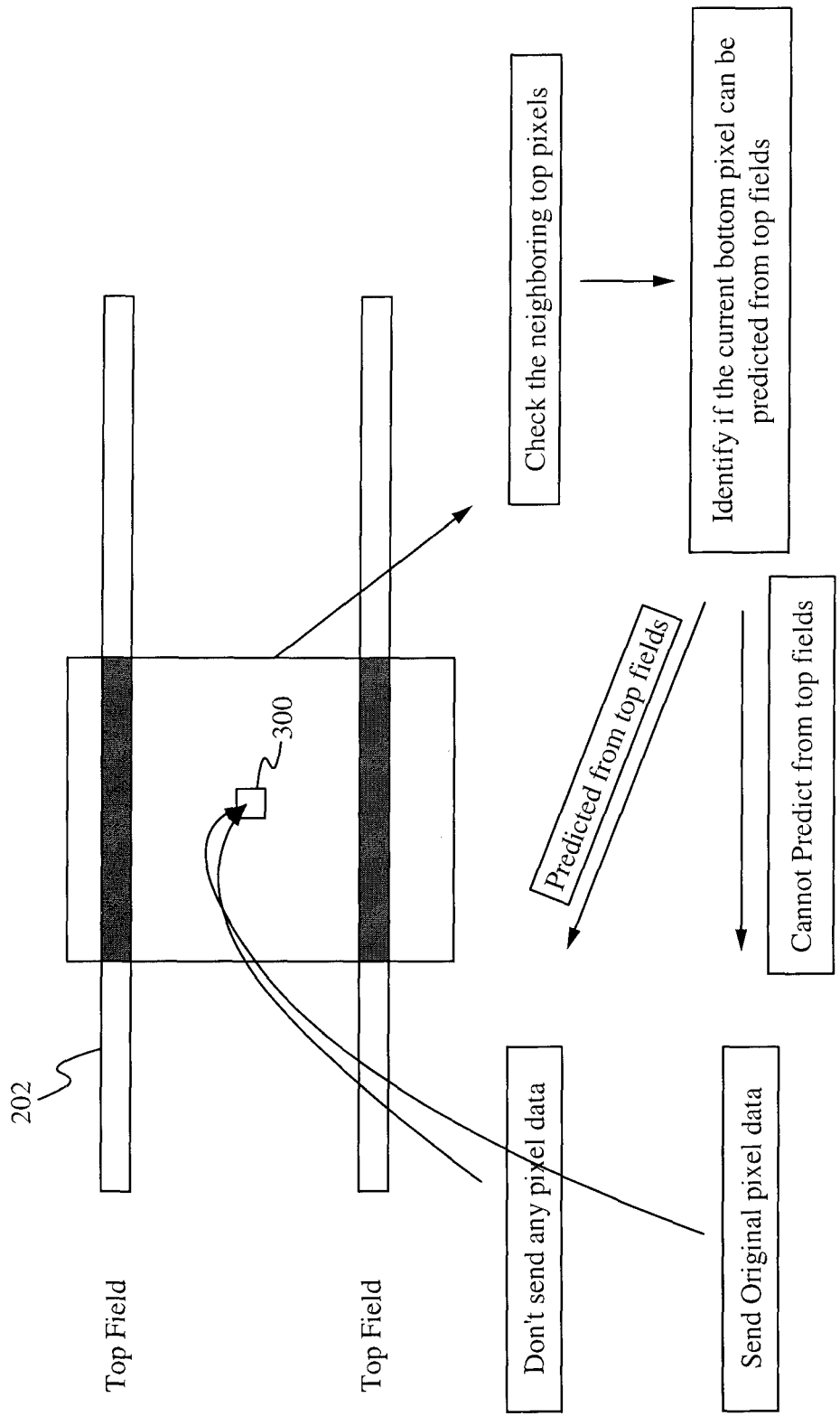
FIG. 3 illustrates a diagram of a compression method using adaptive field data selection according to some embodiments.

FIG. 3 illustrates a diagram of a compression method using adaptive field data selection according to some embodiments. For each pixel in the bottom field, the neighboring pixels in the top field 202 are checked. If a current pixel 300 is able to be predicted using only neighboring top field data, the pixel 300 is removed such that the information is not sent or stored in the compressed version. If the predicted pixel is too different from the current, original pixel 300 to be predicted, then the current, original pixel 300 is retained or sent in the compressed version.

Figure 4:
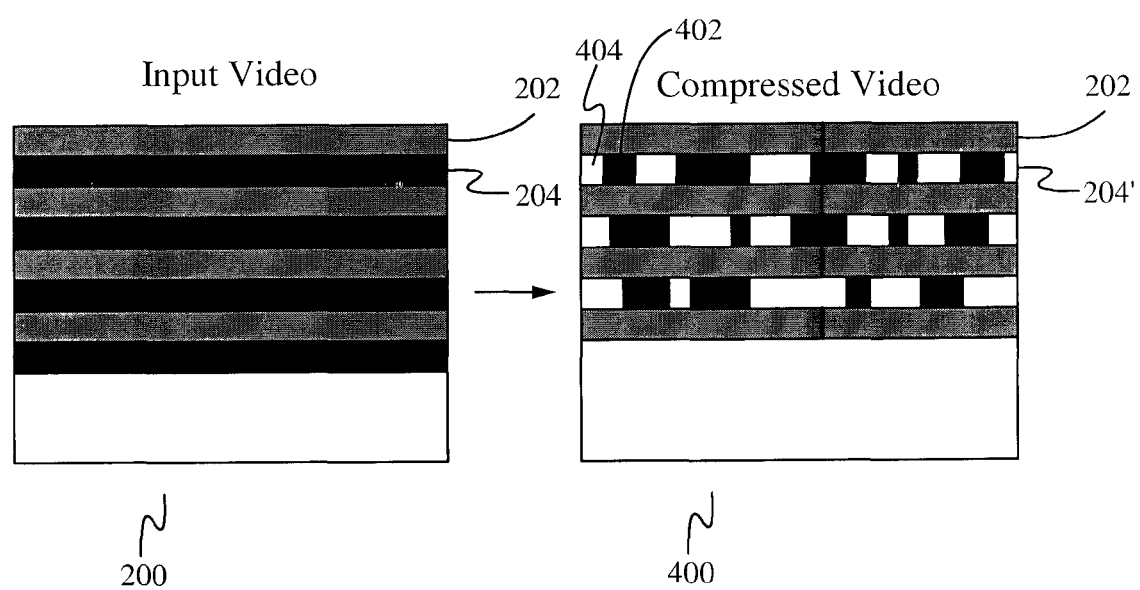
FIG. 4 illustrates a diagram of a result of the compression method using adaptive field data selection according to some embodiments.

FIG. 4 illustrates a diagram of a result of the compression method using adaptive field data selection according to some embodiments. As described above, the input video 200 includes a first (or top) field 202 and a second (or bottom) field 204. In the compressed video 400, the first field 202 is the same as the input video, but the second field 204' is changed. A portion of the bottom field 402 is retained; however, there are many removed second field pixels 404. Thus, the video is compressed significantly, and quality of the video is not degraded.

Figure 5:
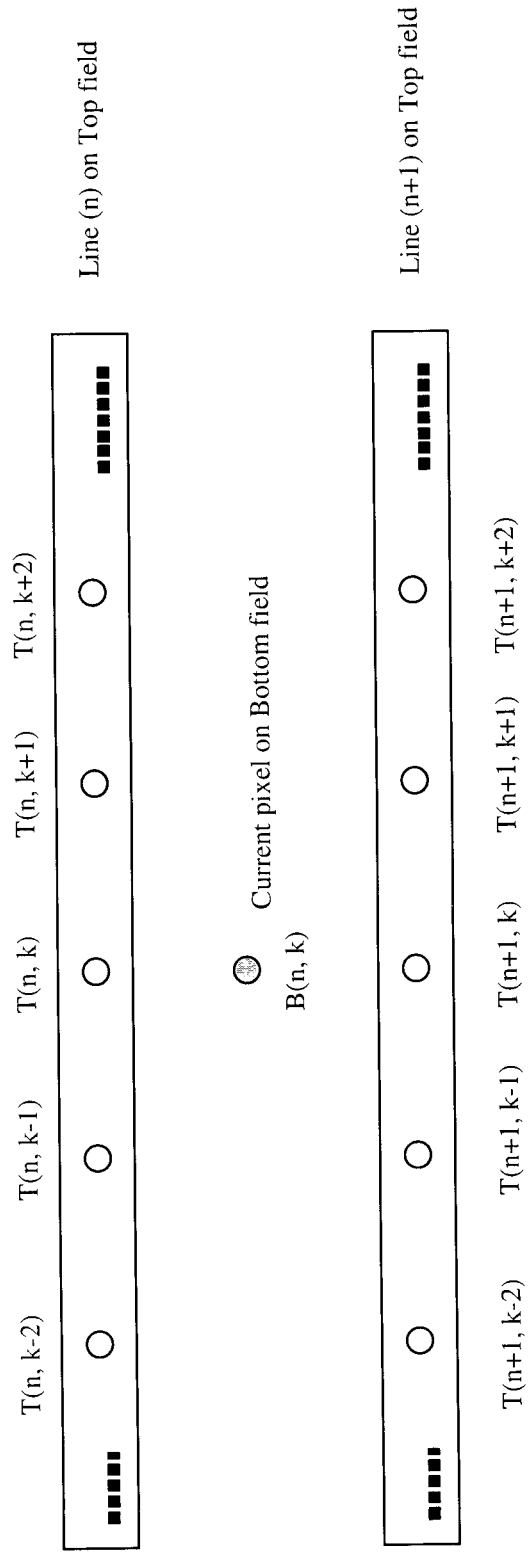
FIG. 5 illustrates a diagram of notation conventions for the pixel locations according to some embodiments.

FIG. 5 illustrates a diagram of notation conventions for the pixel locations according to some embodiments. The pixels on the line (n) in the top field have a first coordinate n and a second coordinate k which is relative to the current pixel in the bottom field. For example, the pixel directly above the current pixel of the bottom field is at position k, but the position above and to the left is k−1 and the position above and to the left twice is k−2. The position above and to the right is k+1 and to the right twice is k+2. The notation continues as such. Furthermore, the pixels on the line (n+1) in the top field have a first coordinate n+1 and a second coordinate k which is relative to the current pixel in the bottom field. Again, pixels to the left and right include subtractions or additions to k.

Figure 6:
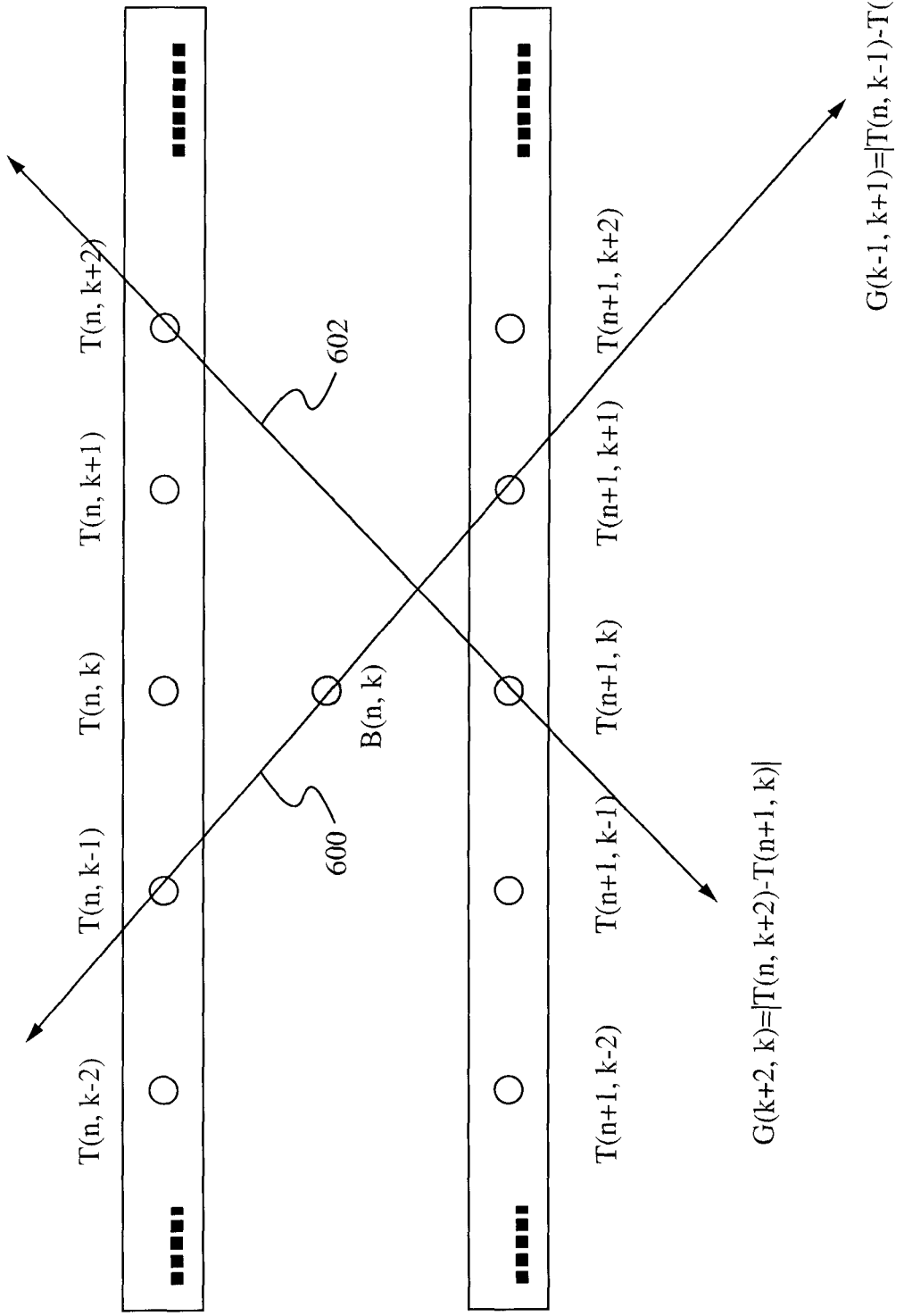
FIG. 6 illustrates a diagram of determining a directional gradient according to some embodiments.

FIG. 6 illustrates a diagram of determining a directional gradient according to some embodiments. The directional gradient is the pixel variation. In FIG. 6, two directional gradients are shown although many gradients are able to be determined/calculated. A first directional gradient 600 is calculated between a pixel at T(n, k−1) and T(n+1, k+1). The gradient is calculated by taking the difference of the pixels such that $G(k-1, k+1)=|T(n, k-1)-T(n+1, k+1)|$. A second gradient 602 is calculated between a pixel at T(n, k+2) and T(n+1, k). The gradient is $G(k+2, k)=|T(n, k+2)-T(n+1, k)|$.

Figure 7:
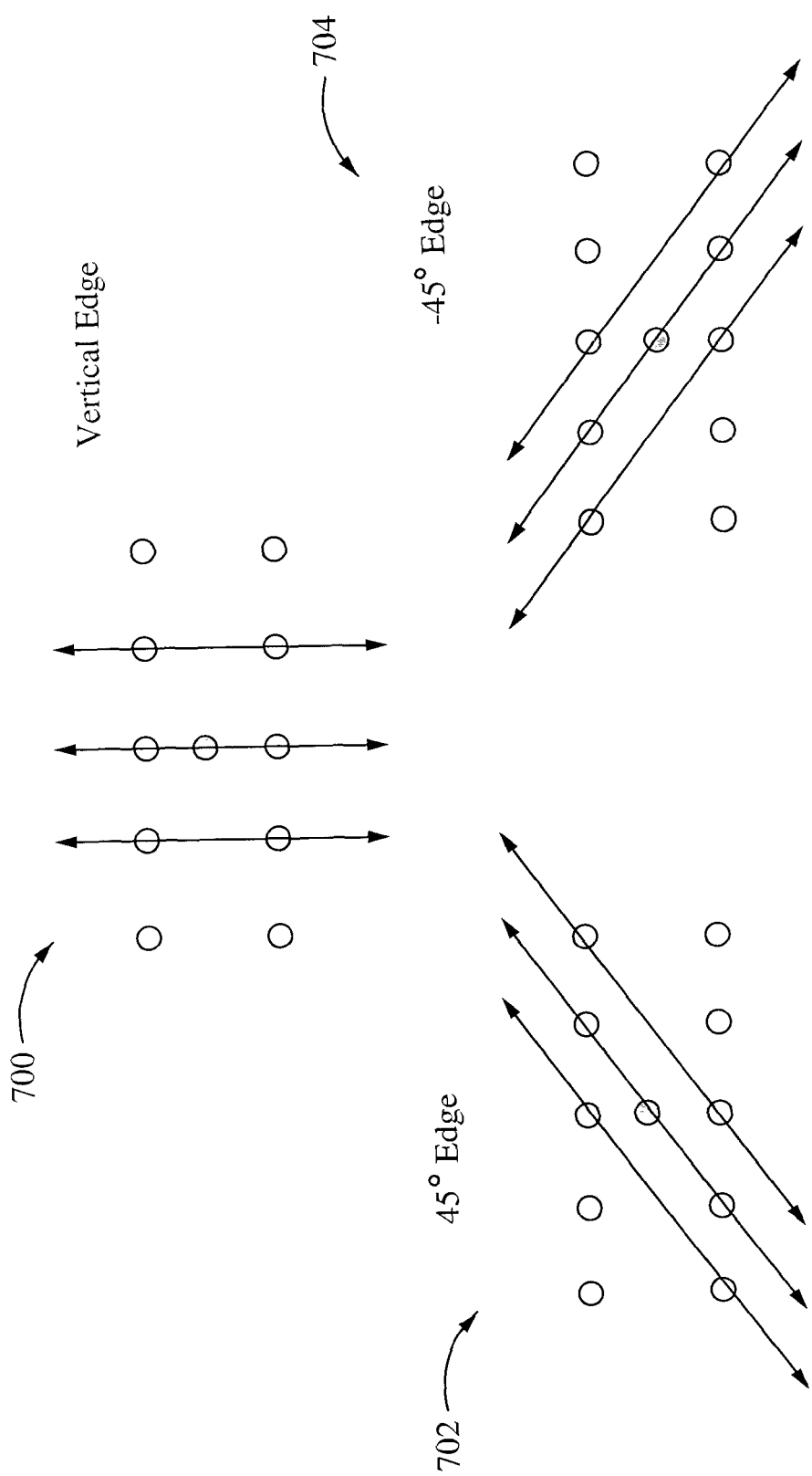
FIG. 7 illustrates a diagram of edge directions according to some embodiments.

FIG. 7 illustrates a diagram of edge directions according to some embodiments. In some embodiments, three edge directions are used for computing gradients. In some embodiments, more or less edge directions are used. As shown in FIG. 7, a vertical edge direction 700, a 45° edge direction 702 and a −45° edge direction 704 are determined.

Figure 8:
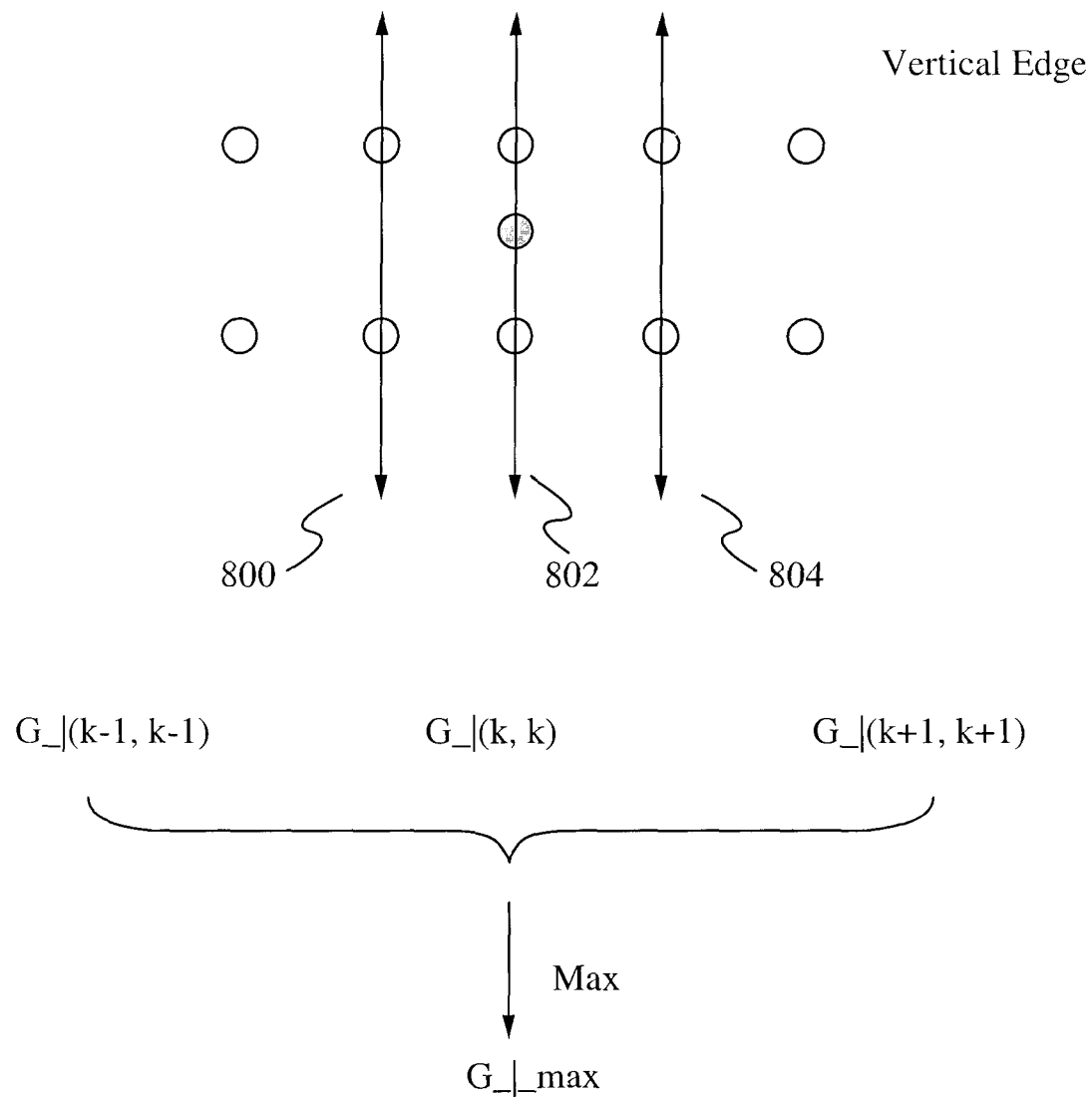
FIG. 8 illustrates a diagram of a vertical edge direction according to some embodiments.

FIG. 8 illustrates a diagram of a vertical edge direction according to some embodiments. A first vertical edge 800 includes the pixels to the left of the current pixel. A second vertical edge 802 includes the pixels in line with the current pixel (e.g. directly above and below). A third vertical edge 804 includes the pixels to the right of the current pixel. The gradients are computed for each of the vertical edges. Then, the maximum gradient of the vertical edges is selected. In some embodiments, more or less vertical edges are computed.

Figure 9:
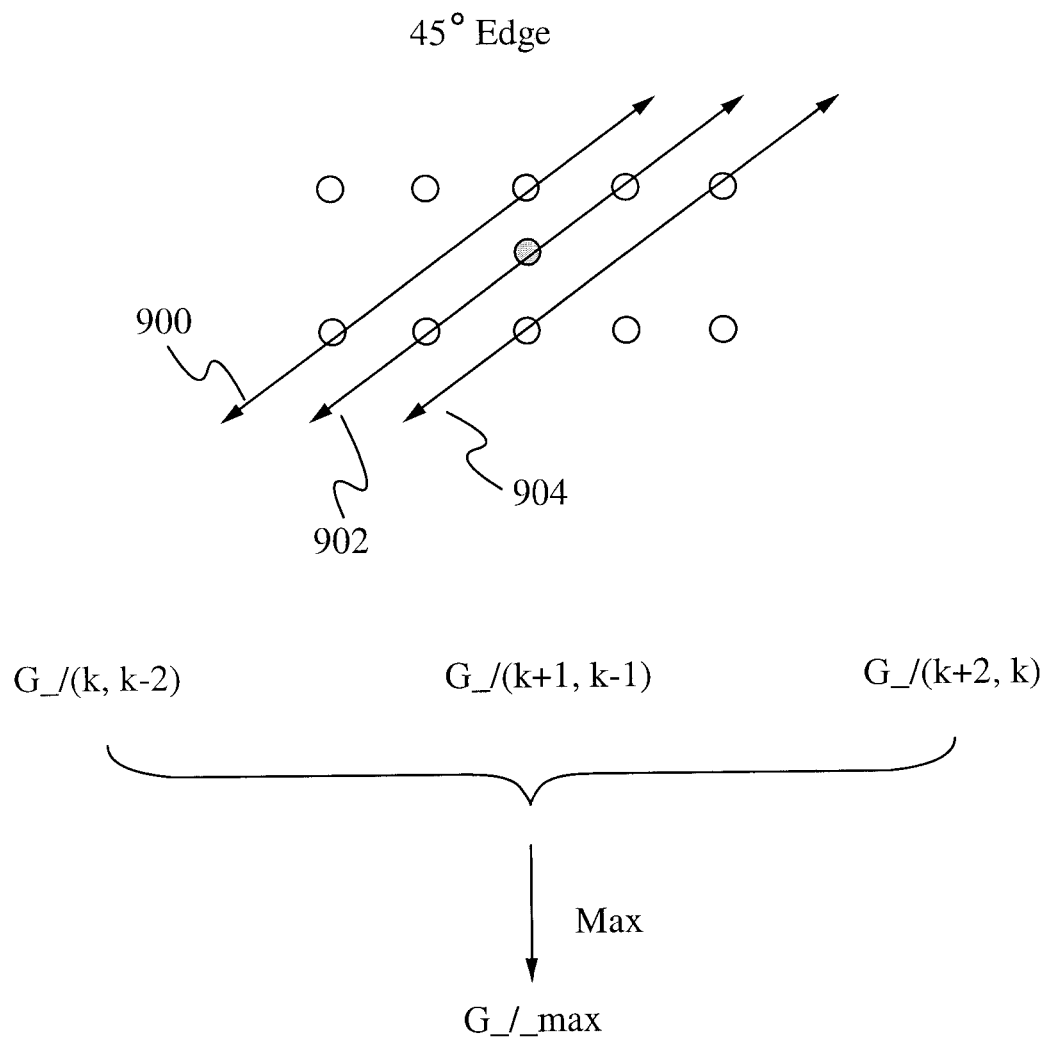
FIG. 9 illustrates a diagram of a 45° edge direction according to some embodiments.

FIG. 9 illustrates a diagram of a 45° edge direction according to some embodiments. A first 45° edge 900 includes a pixel in the top field directly above the current pixel of the bottom field and a pixel in the top field below the current pixel and to the left two positions. A second 45° edge 902 includes a pixel above and to the right and a pixel below and to the left. A third 45° edge 904 includes a pixel above and to the right two positions and a pixel directly below. The gradients are computed for each of the 45° edges. Then, the maximum gradient of the 45° edges is selected. In some embodiments, more or less 45° edges are computed.

Figure 10:
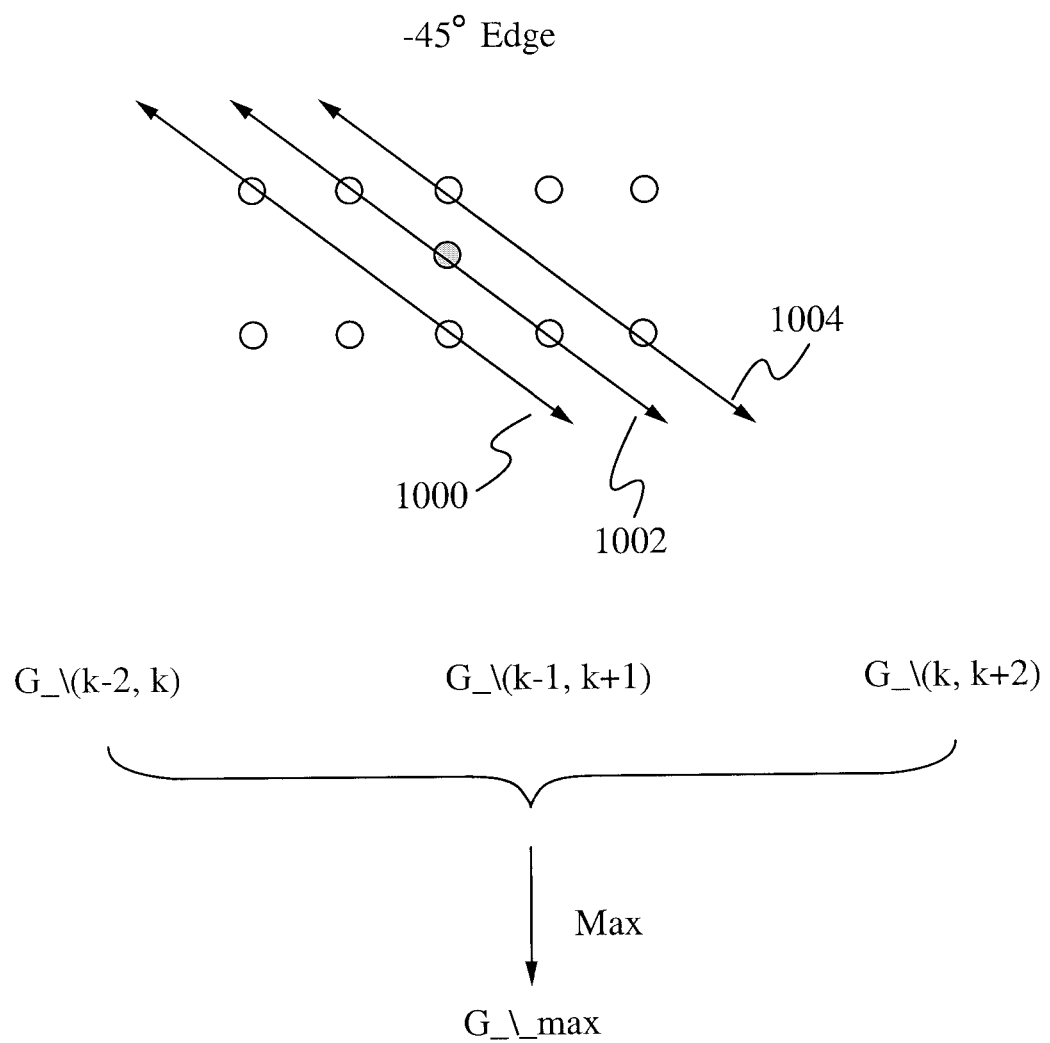
FIG. 10 illustrates a diagram of a −45° edge direction according to some embodiments.

FIG. 10 illustrates a diagram of a −45° edge direction according to some embodiments. A first −45° edge 1000 includes a pixel in the top field above and to the left of the current pixel of the bottom field and a pixel in the top field directly below the current pixel. A second −45° edge 1002 includes a pixel above and to the left and a pixel below and to the right. A third −45° edge 1004 includes a pixel directly above and a pixel below and to the right two positions. The gradients are computed for each of the −45° edges. Then, the maximum gradient of the −45° edges selected. In some embodiments, more or less −45° edges are computed.

After the maximum gradient of each of the edges is determined, the minimum of the maximums is selected. Using FIGS. 8-10 as an example, three maximum gradients are determined (vertical gradient max, 45° gradient max and −45° gradient max). The minimum of those three is selected as the final direction of the gradient of the pixels (G_max_min). The minimum gradient of the pixels is compared with a threshold. The gradient determines how much the pixel is changing. If the gradient is small, that indicates the pixels are similar. If the gradient is large, then the pixels are not similar which indicates that regenerating the pixel could be an issue. Thus, if the gradient is greater than the threshold, then the pixel is coded and the original pixel is inserted into the data. If the gradient is less than or equal to the threshold, the variance of the directional neighboring pixels is computed. If the variance is greater than a second threshold, then the original pixel is inserted into the data. If the variance is less than or equal to the second threshold, then the pixel is able to be predicted from the neighboring pixels, and the information does not need to be included. In some embodiments, this process is repeated for each of the pixels in the video, for each of the pixels in the second (or bottom) field or for each of the pixels another portion of the video.

Figure 11:
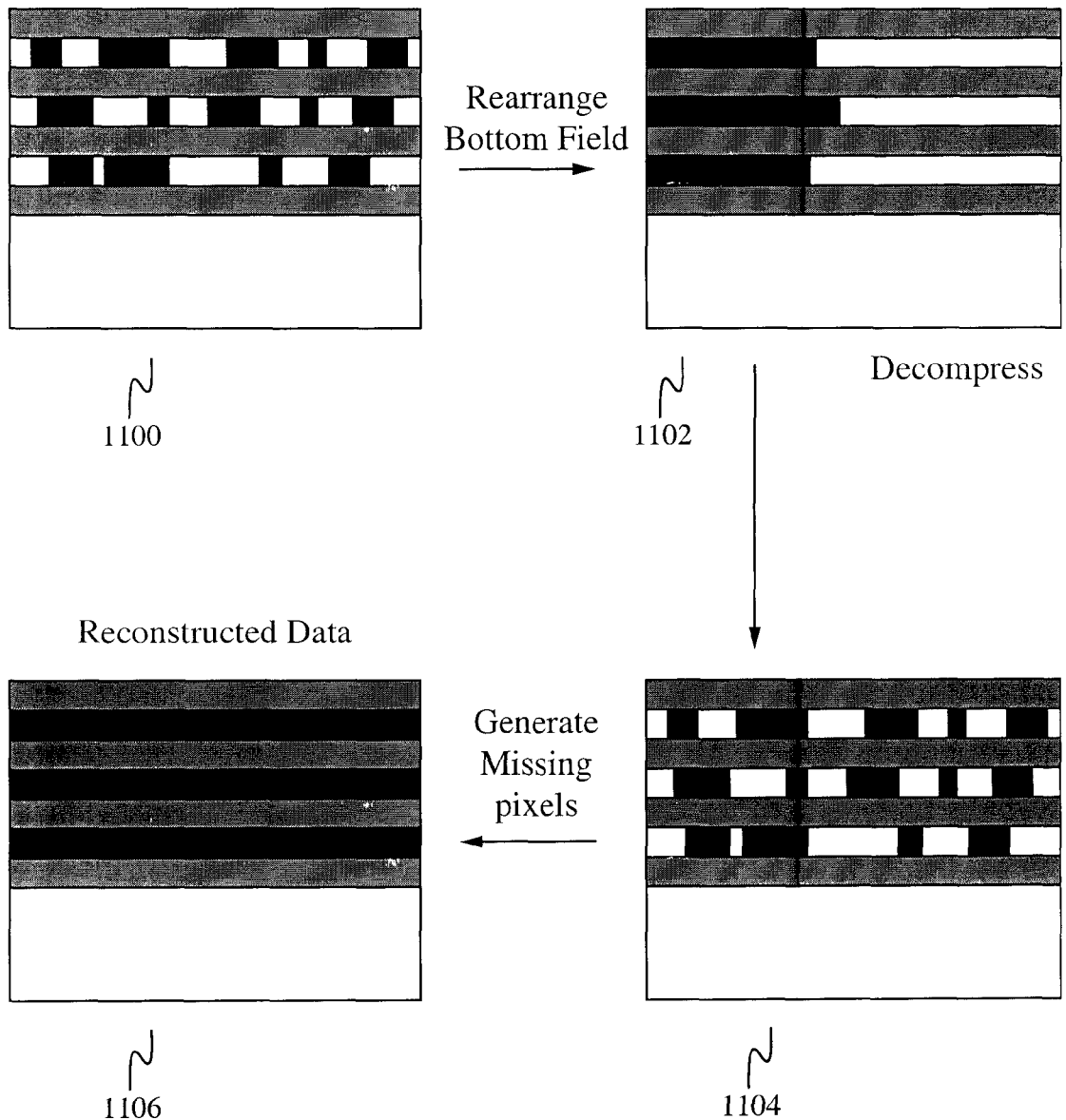
FIG. 11 illustrates a diagram of a process of compressing video using adaptive field data selection according to some embodiments.

FIG. 11 illustrates a diagram of a process of compressing video using adaptive field data selection according to some embodiments. In the diagram 1100, after the selective preservation of pixels has occurred, the compressed video includes the top field and segments of the bottom field. The bottom field is rearranged in the diagram 1102. Any additional compression method is able to be applied to the rearranged data. Then, the decompressed video is shown in diagram 1104. The video is able to be reconstructed using prediction to generate the missing pixels as shown in diagram 1106. Any prediction scheme is able to be used such as averaging.

Figure 12:
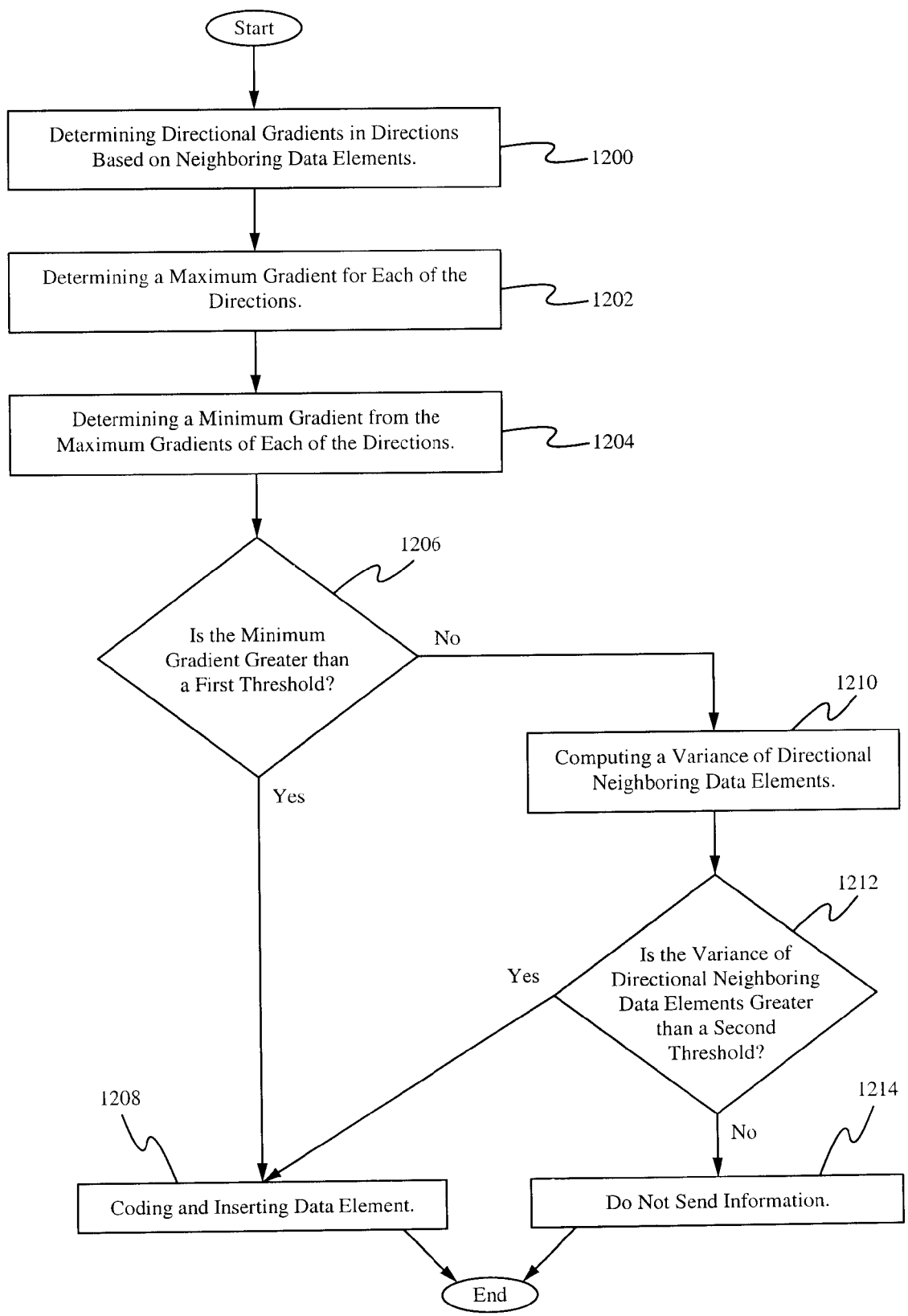
FIG. 12 illustrates a flowchart of a method of compression using adaptive field data selection according to some embodiments.

FIG. 12 illustrates a flowchart of a method of compression using adaptive field data selection according to some embodiments. In the step 1200, one or more directional gradients in one or more directions are determined based on neighboring data elements (e.g. pixels) of a data element (e.g. pixel). For example, if a vertical direction is one of the directions, one or more directional gradients are determined for that direction. Examples of directions include but are not limited to vertical, 45° and −45°. In the step 1202, a maximum gradient is determined for each of the directions. For example, in the vertical direction, if three gradients are determined (one for the left neighboring data element, one for the directly above and below neighboring data elements and one for the right neighboring data elements), the maximum gradient of those three is selected. In the step 1204, a minimum gradient of the determined maximum gradients of the directional gradients is determined. For example, if the maximums determined include vert_max, 45_max and −45_max, the minimum of those three is selected. In the step 1206, the minimum gradient is compared to a first threshold. If the minimum gradient is greater than the first threshold, then the data element is coded and included in the compressed item (e.g. video), in the step 1208. If the minimum gradient is less than or equal to the first threshold, then the variance of directional neighboring data elements is computed, in the step 1210. If the variance is greater than a second threshold in the step 1212, then the data element is coded and included in the compressed item, in the step 1208. If the variance is less than or equal to the second threshold in the step 1212, then information is not sent in the step 1214 since the data element is able to be predicted. This process is repeated for a selected amount of data elements. For example, if the item is divided into first group and second group, the process is able to be repeated for each data element in the second group.

Figure 13:
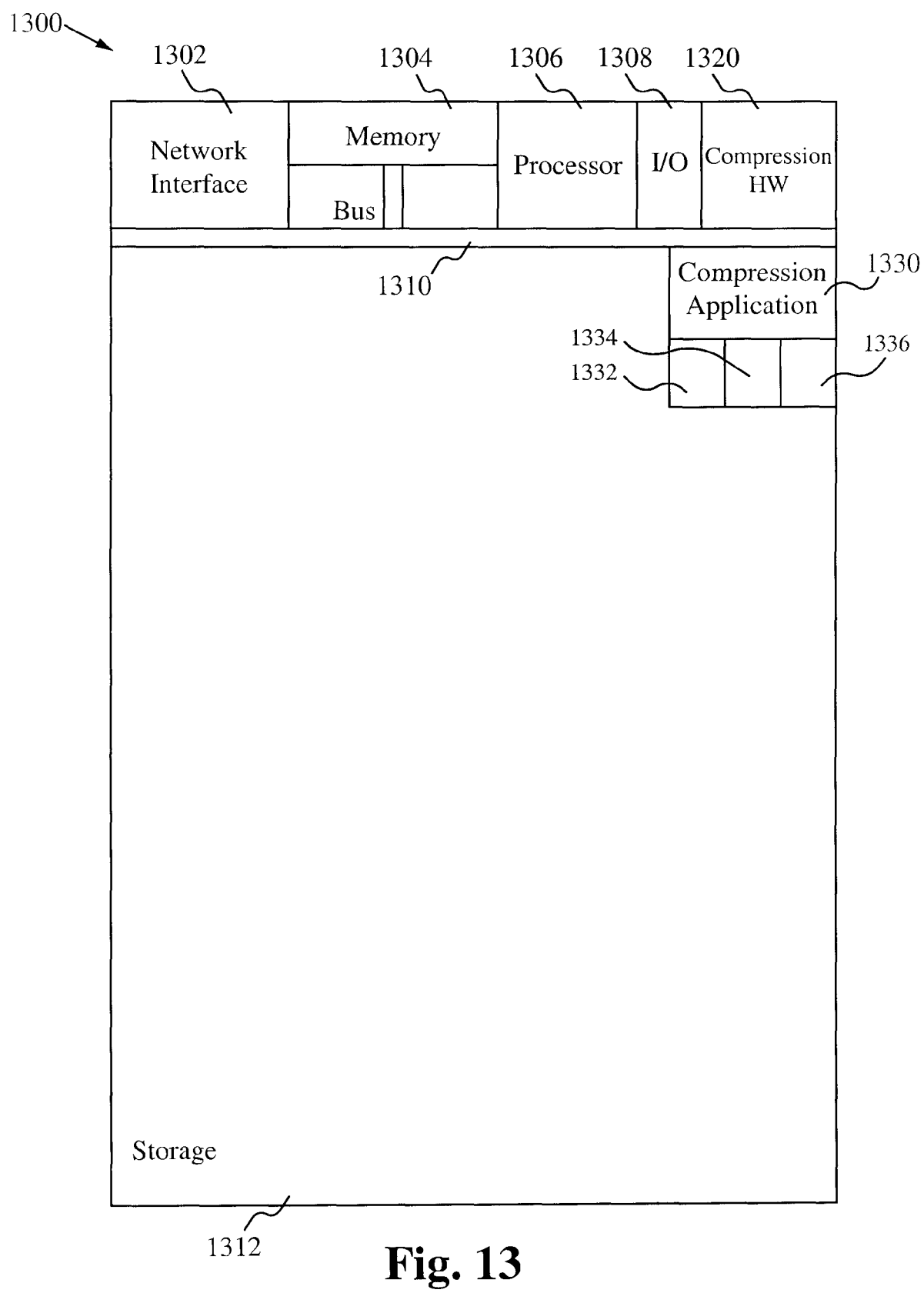
FIG. 13 illustrates a block diagram of an exemplary computing device configured to implement compression using adaptive field data selection according to some embodiments.

FIG. 13 illustrates a block diagram of an exemplary computing device 1300 configured to implement compression using adaptive field data selection according to some embodiments. The computing device 1300 is able to be used to acquire, store, compute, communicate and/or display information such as images and videos. For example, a computing device 1300 is able to acquire and store a video. The compression method using adaptive field data selection is able to be used in compressing video on the device 1300. In general, a hardware structure suitable for implementing the computing device 1300 includes a network interface 1302, a memory 1304, a processor 1306, I/O device(s) 1308, a bus 1310 and a storage device 1312. The choice of processor is not critical as long as a suitable processor with sufficient speed is chosen. The memory 1304 is able to be any conventional computer memory known in the art. The storage device 1312 is able to include a hard drive, CDROM, CDRW, DVD, DVDRW, flash memory card or any other storage device. The computing device 1300 is able to include one or more network interfaces 1302. An example of a network interface includes a network card connected to an Ethernet or other type of LAN. The I/O device(s) 1308 are able to include one or more of the following: keyboard, mouse, monitor, display, printer, modem, touchscreen, button interface and other devices. Compression application(s) 1330 used to perform the compression using adaptive field data selection method are likely to be stored in the storage device 1312 and memory 1304 and processed as applications are typically processed. More or less components shown in FIG. 13 are able to be included in the computing device 1300. In some embodiments, compression hardware 1320 is included. Although the computing device 1300 in FIG. 13 includes applications 1330 and hardware 1320 for compression applications, the compression method is able to be implemented on a computing device in hardware, firmware, software or any combination thereof.

In some embodiments, the compression application(s) 1330 include several applications and/or modules. In some embodiments, the compression application(s) 1330 include a gradient determination module 1332 configured for determining gradients, a variance determination module 1334 configured for determining a variance, an encoding module 1336 configured for encoding the video. In some embodiments, the gradient determination module 1332 determines the gradients as described above and compares the gradient with a first threshold. In some embodiments, the variance determination module 1334 compares the variance with a second threshold. In some embodiments, the encoding module 1336 codes and inserts a pixel or does not send information, depending on the comparisons with the thresholds. In some embodiments, a decoding module configured for decoding is also included. In some embodiments, fewer or additional modules are able to be included.

In some embodiments, there are modules for each direction, wherein each module computes a directional gradient for each direction. In some embodiments, there are modules for determining a maximum gradient for each direction. In some embodiments, there is a module for determining the minimum gradient of the maximum gradients. In some embodiments, there is a module for deciding to code or skip a pixel. In some embodiments, deciding to code or skip includes the steps of comparing the minimum gradient with a first threshold and comparing a variance with a second threshold. The steps shown in FIGS. 12 and/or 14 are able to each be included in a module.

Examples of suitable computing devices include a personal computer, a laptop computer, a computer workstation, a server, a mainframe computer, a handheld computer, a personal digital assistant, a cellular/mobile telephone, a smart appliance, a gaming console, a digital camera, a digital camcorder, a camera phone, a portable music player such as an iPod®, a video player, a DVD writer/player, a television, a home entertainment system or any other suitable computing device.

Figure 14:
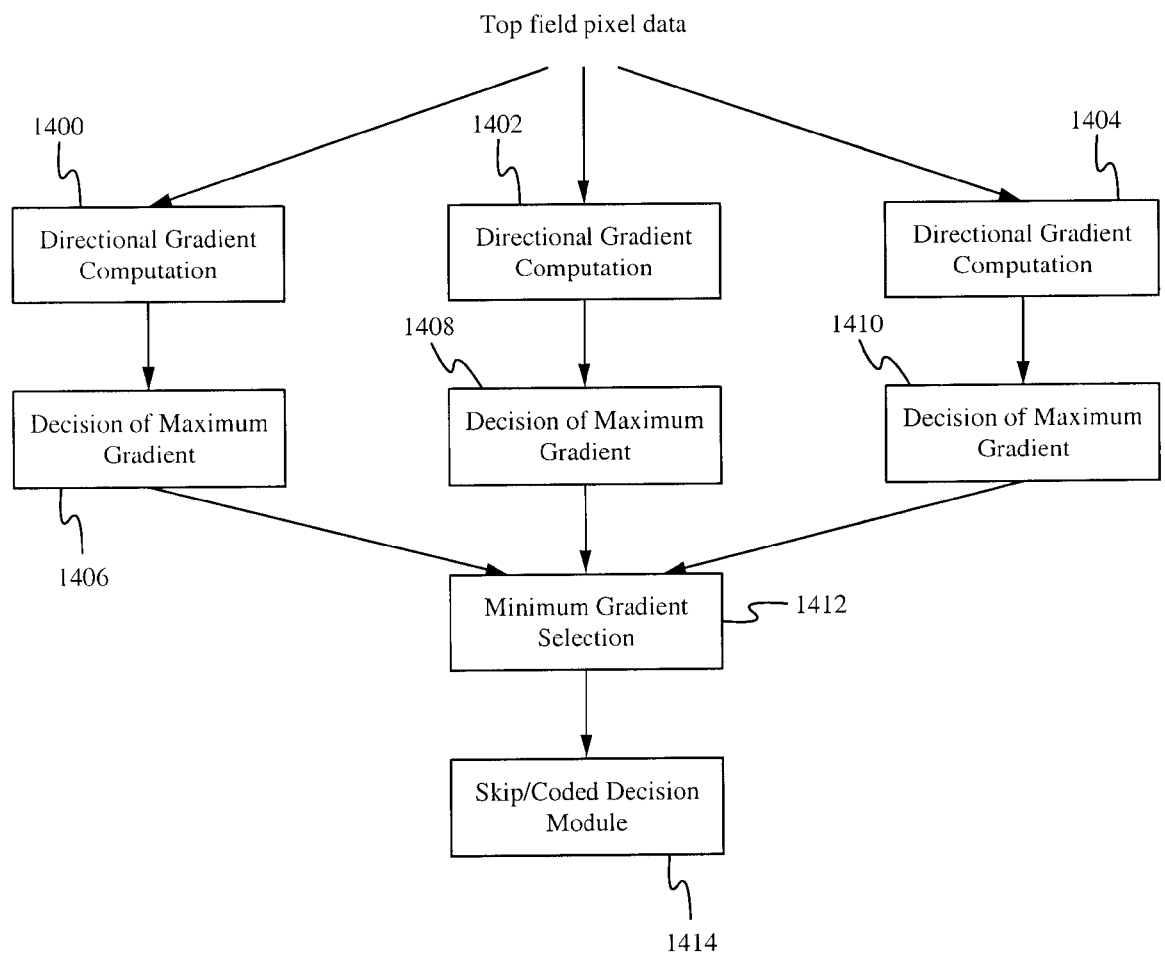
FIG. 14 illustrates a flowchart of a method of compression using adaptive field data selection according to some embodiments.

FIG. 14 illustrates a flowchart of a method of compression using adaptive field data selection according to some embodiments. Initially, the process starts with top field pixel data. In the step 1400, one or more directional gradients in a first direction (e.g. horizontal) are determined based on neighboring pixels of a current pixel (in a bottom field). In the step 1402, one or more directional gradients in a second direction (e.g. 45°) are determined based on neighboring pixels of a current pixel (in a bottom field). In the step 1404, one or more directional gradients in a second direction (e.g. −45°) are determined based on neighboring pixels of a current pixel (in a bottom field). In the step 1406, a maximum gradient is determined for the gradients in the first direction. For example, if three gradients are determined (one for the left neighboring pixels, one for the directly above and below neighboring pixels and one for the right neighboring pixels), the maximum gradient of those three is selected. In the step 1408, a maximum gradient is determined for the gradients in the second direction. In the step 1410, a maximum gradient is determined for the gradients in the third direction. In the step 1412, a minimum gradient of the determined maximum gradients is determined or selected. For example, if the maximums determined include vert_max, 45_max and −45_max, the minimum of those three is selected. In the step 1414, an encoding module (also referred to as a skip/coded decision module) determines to code the pixel or skip the pixel based on the steps described above. The steps include comparing the minimum gradient to a first threshold and comparing a variance to a second threshold.

To utilize the compression method using adaptive field data selection, a user acquires a video such as by a digital camcorder, and while the video is acquired, the compression method compresses the video. In some embodiments, the camcorder automatically compresses the video using the method described herein, and in some embodiments, a user manually selects to compress the video using this method. The video is also decompressed at the appropriate time such as for displaying the video.

In operation, the compression method using adaptive field data selection enables significant compression of a video without degradation of the quality of the video. Furthermore, the compression method enables video such as high definition video to be compressed and utilized more easily.

In some embodiments, other items are able to be compressed using the compression method using adaptive field data such as images, sounds, music and other data. Although videos and pixels have been described above, any data element in any item is able to be used in the compression method.

For example, instead of neighboring pixels, neighboring data elements are able to be used, where the data elements correspond to that type of item.

Although the phrases "top field" and "bottom field" are used herein, these specific entities are not required for use with the method described herein. Any implementation of the video is able to utilize the method described herein.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims.

What is claimed is:

1. A method of compressing data implemented on a device comprising:
 a. checking neighboring data elements in a first field of a current data element in a second field, including:
  i. determining directional gradients for each direction of a set of directions based on the neighboring data elements of the current data element;
  ii. determining a set of maximum gradients of the directional gradients, a maximum gradient for each direction of the set of directions; and
  iii. determining a minimum gradient of the set of maximum gradients;
 b. if the current data element is able to be predicted using neighboring data elements, then the current data element is removed; and
 c. if the current data element is not able to be predicted using the neighboring data elements, then the current data element is retained.

2. The method of claim 1 wherein the current data element is retained includes:
 a. coding and inserting the current data element into a compressed item if the minimum gradient is greater than a first threshold;
 b. computing a variance of the neighboring data elements if the minimum gradient is not greater than the first threshold; and
 c. coding and inserting the current data element into the compressed item if the variance is greater than a second threshold.

3. The method of claim 2 wherein the current data element is removed includes not sending information if the variance is not greater than the second threshold.

4. The method of claim 1 further comprising repeating a-c for data elements in a second field.

5. The method of claim 4 further comprising rearranging the second field.

6. The method of claim 1 wherein the set of directions include vertical, 45° and −45°.

7. The method of claim 1 wherein the compressed data is selected from the group consisting of an image, a video, a sound and music.

8. The method of claim 1 wherein the device is selected from the group consisting of a personal computer, a laptop computer, a computer workstation, a server, a mainframe computer, a handheld computer, a personal digital assistant, a cellular/mobile telephone, a smart appliance, a gaming console, a digital camera, a digital camcorder, a camera phone, a portable music player, a video player, a DVD writer/player, a television and a home entertainment system.

9. A method of compressing data implemented on a device comprising:
 a. checking neighboring pixels in a first field of a current pixel in a second field, including:
  i. determining directional gradients for each direction of a set of directions based on the neighboring pixels of the current pixel;
  ii. determining a set of maximum gradients of the directional gradients, a maximum gradient for each direction of the set of directions; and
  iii. determining a minimum gradient of the set of maximum gradients;
 b. if the current pixel is able to be predicted using neighboring pixels, then the current pixel is removed; and
 c. if the current pixel is not able to be predicted using the neighboring pixels, then the current pixel is retained.

10. The method of claim 9 wherein the current pixel is retained includes:
 a. coding and inserting the current pixel into a compressed video if the minimum gradient is greater than a first threshold;
 b. computing a variance of the neighboring pixels if the minimum gradient is not greater than the first threshold; and
 c. coding and inserting the current pixel into the compressed video if the variance is greater than a second threshold.

11. The method of claim 10 wherein the current pixel is removed includes not sending information if the variance is not greater than the second threshold.

12. The method of claim 9 further comprising repeating a-c for pixels in a second field.

13. The method of claim 12 further comprising rearranging the second field.

14. The method of claim 9 wherein the set of directions include vertical, 45° and −45°.

15. The method of claim 9 wherein the compressed data is selected from the group consisting of an image and a video.

16. The method of claim 9 wherein the device is selected from the group consisting of a personal computer, a laptop computer, a computer workstation, a server, a mainframe computer, a handheld computer, a personal digital assistant, a cellular/mobile telephone, a smart appliance, a gaming console, a digital camera, a digital camcorder, a camera phone, a portable music player, a video player, a DVD writer/player, a television and a home entertainment system.

17. A method implemented on a device comprising:
 a. determining directional gradients for each direction of a set of directions based on neighboring pixels of a current pixel;
 b. determining a set of maximum gradients of the directional gradients, a maximum gradient for each direction of the set of directions;
 c. determining a minimum gradient of the set of maximum gradients;
 d. coding and inserting the current pixel into a compressed data if the minimum gradient is greater than a first threshold;
 e. computing a variance of the neighboring pixels if the minimum gradient is not greater than the first threshold;
 f. coding and inserting the current pixel into the compressed data if the variance is greater than a second threshold; and
 g. not sending information if the variance is not greater than the second threshold.

18. The method of claim 17 further comprising repeating a-g for pixels in a field.

19. The method of claim 18 further comprising rearranging the field.

20. The method of claim 19 further comprising decompressing the compressed data.

21. The method of claim 20 further comprising reconstructing data by regenerating the pixels that were not coded and inserted.

22. The method of claim 17 wherein the set of directions include vertical, 45° and −45°.

23. The method of claim 17 wherein the compressed data is selected from the group consisting of an image and a video.

24. The method of claim 17 wherein the device is selected from the group consisting of a personal computer, a laptop computer, a computer workstation, a server, a mainframe computer, a handheld computer, a personal digital assistant, a cellular/mobile telephone, a smart appliance, a gaming console, a digital camera, a digital camcorder, a camera phone, a portable music player, a video player, a DVD writer/player, a television and a home entertainment system.

25. A system implemented on a device configured for compressing data comprising:
   a. a gradient determination module configured for determining one or more gradients;
   b. a variance determination module operatively coupled to the gradient determination module, the variance determination module configured for determining a variance; and
   c. an encoding module operatively coupled to the variance determination module, the encoding module configured for encoding video
   wherein the gradient determination module is further configured to determine maximum gradients of the gradients and compare a minimum gradient of the maximum gradients with a first threshold.

26. The system of claim 25 wherein the variance determination module is further configured to compare the variance with a second threshold.

27. The system of claim 25 wherein the encoding module is further configured to code and insert a pixel or to not send information, depending on results of the gradient determination module and the variance determination module.

28. The system of claim 25 wherein the device is selected from the group consisting of a personal computer, a laptop computer, a computer workstation, a server, a mainframe computer, a handheld computer, a personal digital assistant, a cellular/mobile telephone, a smart appliance, a gaming console, a digital camera, a digital camcorder, a camera phone, a portable music player, a video player, a DVD writer/player, a television and a home entertainment system.

29. A device comprising:
   a. a memory for storing an application, the application configured for:
      i. determining directional gradients for each direction of a set of directions based on neighboring pixels of a current pixel;
      ii. determining a set of maximum gradients of the directional gradients, a maximum gradient for each direction of the set of directions;
      iii. determining a minimum gradient of the set of maximum gradients;
      iv. coding and inserting the current pixel into a compressed data if the minimum gradient is greater than a first threshold;
      v. computing a variance of the neighboring pixels if the minimum gradient is not greater than the first threshold;
      vi. coding and inserting the current pixel into the compressed data if the variance is greater than a second threshold; and
      vii. not sending information if the variance is not greater than the second threshold; and
   b. a processing component coupled to the memory, the processing component configured for processing the application.

30. The device of claim 29 wherein the application is further configured for repeating i-vii for pixels in a field.

31. The device of claim 30 wherein the application is further configured for rearranging the field.

32. The device of claim 31 wherein the application is further configured for decompressing the video.

33. The device of claim 32 wherein the application is further configured for reconstructing data by regenerating the pixels that were not coded and inserted.

34. The device of claim 29 wherein the set of directions include vertical, 45° and −45°.

35. The device of claim 29 wherein the device is selected from the group consisting of a personal computer, a laptop computer, a computer workstation, a server, a mainframe computer, a handheld computer, a personal digital assistant, a cellular/mobile telephone, a smart appliance, a gaming console, a digital camera, a digital camcorder, a camera phone, a portable music player, a video player, a DVD writer/player, a television and a home entertainment system.

36. A device comprising:
   a. a memory for storing an application, the application configured for:
      i. determining a first set of directional gradients for a 45° direction based on neighboring pixels of a current pixel;
      ii. determining a second set of directional gradients for a vertical direction based on the neighboring pixels of the current pixel;
      iii. determining a third set of directional gradients for a −45° direction based on the neighboring pixels of the current pixel;
      iv. determining a first maximum gradient of the first set of directional gradients;
      v. determining a second maximum gradient of the second set of directional gradients;
      vi. determining a third maximum gradient of the third set of directional gradients;
      vii. determining a minimum gradient of the first maximum gradient, the second maximum gradient and the third maximum gradient;
      viii. coding and inserting the current pixel into a compressed data if the minimum gradient is greater than a first threshold;
      ix. computing a variance of the neighboring pixels if the minimum gradient is not greater than the first threshold;
      x. coding and inserting the current pixel into the compressed data if the variance is greater than a second threshold;
      xi. not sending information if the variance is not greater than the second threshold;
      xii. repeating steps i-xi for pixels in a bottom field distinguishable from a top field;
      xiii. rearranging the bottom field; and
      xiv. applying an additional compression to the rearranged bottom field; and b. a processing component coupled to the memory, the processing component configured for processing the application.

\* \* \* \* \*